US005604462A

United States Patent [19]
Gans et al.

[11] Patent Number: 5,604,462
[45] Date of Patent: Feb. 18, 1997

[54] INTERMODULATION DISTORTION DETECTION IN A POWER SHARED AMPLIFIER NETWORK

[75] Inventors: Michael J. Gans, Holmdel; Yu S. Yeh, Freehold, both of N.J.

[73] Assignee: Lucent Technologies Inc., Murray Hill, N.J.

[21] Appl. No.: 560,450

[22] Filed: Nov. 17, 1995

[51] Int. Cl.⁶ .................................. H03F 3/68; H03F 3/26
[52] U.S. Cl. .................................. 330/124 R; 330/124 D; 330/149
[58] Field of Search .................................. 330/52, 124 D, 330/124 R, 149, 295; 455/103, 114

[56] References Cited

U.S. PATENT DOCUMENTS

| | | | |
|---|---|---|---|
| 3,480,885 | 11/1969 | Schrank | 333/7 |
| 3,731,217 | 5/1973 | Gerst et al. | 330/56 |
| 3,917,998 | 11/1975 | Welti | 325/3 |
| 4,618,831 | 10/1986 | Egani et al. | 330/124 D X |
| 4,907,004 | 3/1990 | Zacharatos | 342/373 |
| 4,965,587 | 10/1990 | Lenormand et al. | 342/322 |
| 5,093,668 | 3/1992 | Sreenivas | 342/374 |
| 5,105,170 | 4/1992 | Joshi | 333/113 |
| 5,115,248 | 5/1992 | Roederer | 342/373 |
| 5,119,042 | 6/1992 | Crampton et al. | 330/295 |
| 5,414,433 | 5/1995 | Chang | 342/375 |

FOREIGN PATENT DOCUMENTS

355979A2  2/1990  European Pat. Off. .

OTHER PUBLICATIONS

W. A. Sandrin, "The Butler Matrix Transponder", Comsat Technical Review, vol. 4, No. 2, Fall 1974.
B. Widrow et al., "Adaptive Antenna Systems", Proceedings of the IEEE, vol. 55, No. 12, Dec. 1967, pp. 2143–2159.
H. Foster et al., Butler Network Extension To Any Number of Antenna Ports, IEEE Transactions on Antennas and Propagations, Nov. 1970, pp. 818–820.
R. Johnson, Antenna Engineering Handbook, McGraw Hill Publishing Co., 3rd edition, 1993, pp. 20–59 to 20–60.

*Primary Examiner*—Steven Mottola

[57] ABSTRACT

An intermodulation distortion (IMD) detection system improves IMD reduction capability of power shared linear amplifier networks. In one embodiment, first and second power sharing networks, preferably Butler Matrices, are provided with a plurality of linear amplifier circuits coupled therebetween. A plurality of input signals are applied to respective input ports of the first power sharing network, with a portion of each input signal amplified by each amplifier circuit and then recombined in the second power sharing network so that each amplified input signal appears at only one output port of the second power sharing network. An antenna coupled to each of these output ports then radiates the amplified signal energy associated with one of the input signals. A test signal, which may be a dual tone signal, is applied to another input port of the first power sharing network, where it is split and amplified by each amplifier circuit. Each amplifier circuit includes detection circuitry for detecting IMD energy of the test signal produced in the amplifier, which is also indicative of the IMD energy generated due to the amplification of the input signals. The amplified test signal is then recombined by the second power sharing network so that it appears only at one output port, where it is terminated.

26 Claims, 11 Drawing Sheets

5,604,462

INTERMODULATION DISTORTION DETECTION IN A POWER SHARED AMPLIFIER NETWORK

FIELD OF THE INVENTION

The present invention relates to a system for intermodulation distortion (IMD) detection and reduction in an amplifier network. More particularly, it relates to an IMD detection system in a power shared linear amplifier network, which can be useful in wireless communications, and in which the IMD power of a plurality of amplifiers in the network can be detected by means of a test signal input.

BACKGROUND OF THE INVENTION

Wireless telecommunications systems in the prior art typically employ a linear, high-power amplifier with each transmitting antenna at the base station. Typically, the linear amplifier is used to amplify the modulated radio frequency (RF) signals of a plurality of frequency channels for transmission to mobile or stationary users. Multi-sector systems employ a plurality of directional antennas to radiate directional beams over complementing azimuthal sectors, thereby attaining 360° coverage with improved range. Single sector systems utilize a single omnidirectional antenna to provide 360° coverage. In either case, as the amplifier input power increases, so can the intermodulation distortion products, which result in undesirable interchannel interference.

When the traffic on the telecommunications system is operating near its maximum capacity, the IMD products generated can become excessively high, since at this time the amplifiers are generally saturated. In directional antenna systems, a particular problem arises when a large number of users are communicating from a single location. In this scenario, the amplifier associated with the antenna transmitting to that location can become saturated, while the other amplifiers, which service other azimuthal sectors, may be underutilized. In addition to generating high IMD products, the reliability of the saturated, overburdened amplifier can decrease as thermal stress begins to take its toll.

One solution to these problems is disclosed in co-pending U.S. patent application Ser. No. 08/506,286 entitled "Power Shared Linear Amplifier Network" and assigned to the assignee herein. Therein, a system is described, which comprises a plurality of amplifiers to produce the total radiated power, with each amplifier providing an approximately equal amount of amplified RF power. This is typically accomplished by using at least one power sharing network, such as a Butler matrix, to spread the input signal among a number of output ports with a phase progression therebetween. Typically, with this system, no single amplifier will be driven deeper into saturation than will the others, thereby enhancing the amplifier reliability and reducing IMD product generation. Optionally, a second Butler matrix is used to recombine the RF power after amplification by the linear amplifiers so that the directional radiating antennas (if used) need not share the same aperture.

SUMMARY OF THE INVENTION

Embodiments of the present invention can improve IMD reduction capability of power shared amplifier networks by providing an IMD detection system without interfering with the amplification of the transmitted RF signals. In one embodiment, first and second power sharing networks, preferably Butler Matrices, are provided with a plurality of linear amplifier circuits coupled therebetween. A plurality of input signals are applied to respective input ports of the first power sharing network, with a portion of each input signal amplified by each amplifier circuit and then recombined in the second power sharing network so that each amplified input signal preferably appears at only one output port of the second power sharing network. An antenna coupled to each of these output ports thereby radiates the amplified signal energy associated with one of the input signals.

In a typical embodiment of the present invention, a test signal, which may be a dual tone signal, is applied to another input port of the first power sharing network, where it is split and amplified by each amplifier circuit. Each amplifier circuit includes detection circuitry for detecting the IMD power of the test signal produced in the amplifier, which is also indicative of the IMD power generated due to the amplification of the input signals. The amplified test signal is then recombined by the second power sharing network so that it appears only at one output port, where it is terminated.

Optionally, each linear amplifier of the amplifier circuits is of the predistortion type, including a cuber circuit for generating third-order IMD power, followed by a low noise amplifier (LNA). With this configuration, the detected IMD power can be supplied to a control circuit to control the gain of the LNA responsive to the amount of IMD power detected. In this manner, the IMD products generated within the amplifier circuits can be reduced or minimized and the dynamic range of the system improved.

In a special case, the power sharing networks are each 2×2 networks, and only a single, multichannel input signal is amplified and then radiated by an omnidirectional antenna, while the test signal is terminated in the unused output port.

BRIEF DESCRIPTION OF THE DRAWINGS

For a full understanding of the present invention, reference is had to exemplary embodiments thereof, considered in conjunction with the accompanying drawings wherein like reference numerals designate like elements or features, for which.

DETAILED DESCRIPTION OF THE INVENTION

Figure 1:
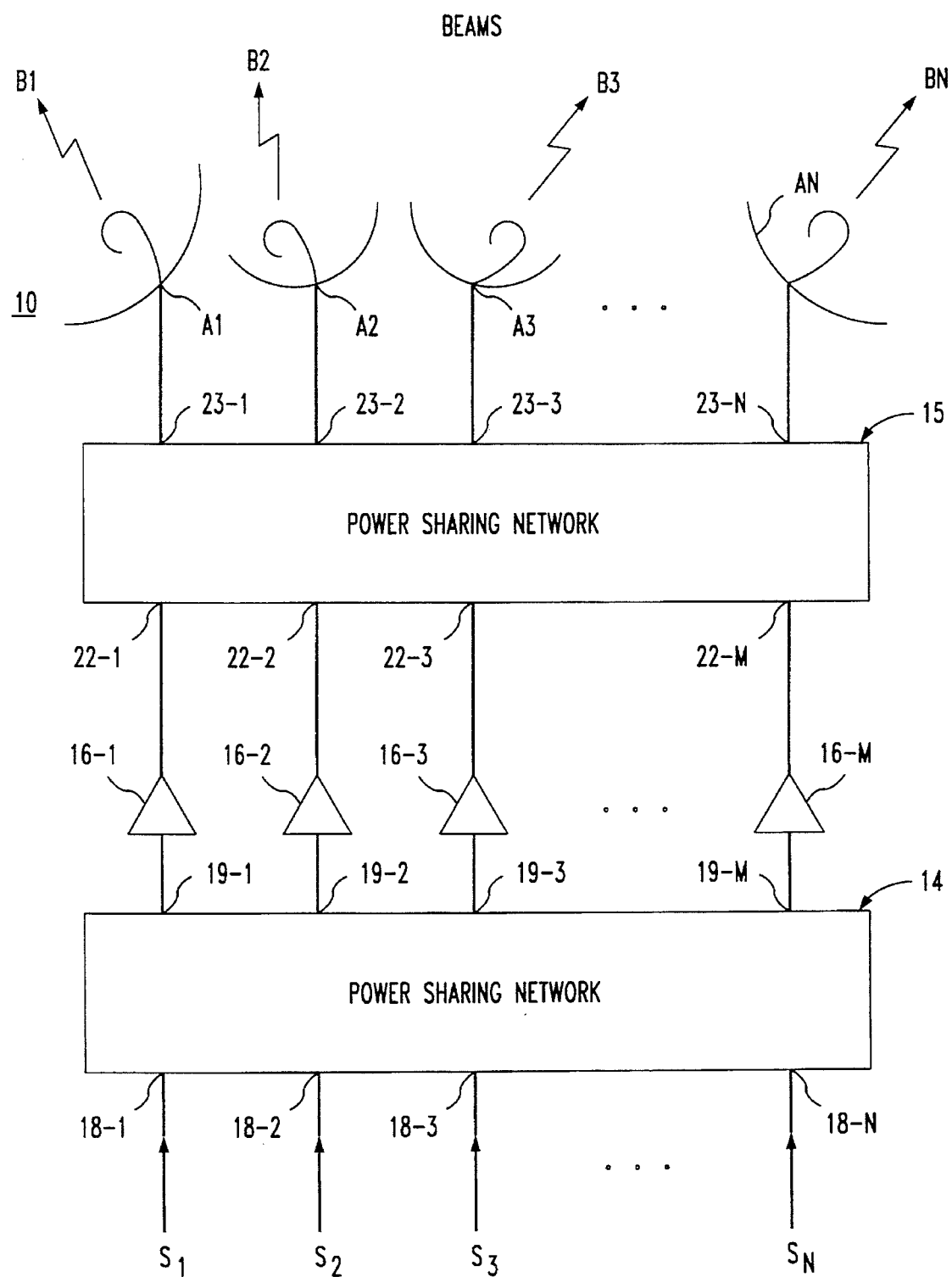
FIG. 1 shows a schematic diagram of a transmitting system using a balanced amplifier network.

FIG. 1 shows a schematic diagram of a wireless transmitting system, designated generally as 10, that is similar to a system disclosed in co-pending U.S. patent application Ser. No. 08/506,286, the subject matter of which is incorporated herein by reference. System 10 employs N directional antennas A1 to AN to radiate N corresponding antenna beams B1 to BN of modulated RF power. First power sharing network 14 has N input ports, 18-1 to 18-N, where input RF signals $S_1$ to $S_N$ are applied, respectively. Each signal $S_1$ to $S_N$ may be a frequency division multiplexed (FDM) signal having many frequency channels, and is transmitted by respective beam B1 to BN.

Power sharing network 14 divides each signal $S_1$ to $S_N$ among M output ports 19-1 to 19-M where the integer M can equal the integer N. The particular input port 18-i to which a given one of the signals $S_1$ to $S_N$ is applied will determine the phase gradient associated with the energy of that signal which appears among output ports 19-1 to 19-N. Hence, the signal $S_1$ applied to port 18-1 will produce $S_1$ signal power at each output port 19-1 to 19-M with a first phase gradient between the output ports; the $S_N$ signal applied to port 18-N will produce $S_N$ signal power at each output port 19-1 to 19-M at a second phase gradient therebetween, different from the first phase gradient.

Typically, power sharing network 14 is a Butler Matrix, but it can also be, for example, a hybrid or Wilkinson coupler. Briefly, a Butler Matrix is a passive and reciprocal RF device which performs the standard mathematical transform of a linear array (i.e., a spatial Fourier transform). Butler Matrices and their operation are well-known in the art—see, for example, "Antenna Engineering Handbook", chapter 19, by R. Johnson, McGraw Hill Publishing Co., 3rd edition.

Coupled to each output port 19-1 to 19-M is a linear power amplifier 16-1 to 16-M, which is designed to operate over a predetermined dynamic range of input powers for low distortion operation. Each amplifier preferably amplifies the power of all signals $S_1$ to $S_N$, superimposed upon one another. Since power sharing network 14 advantageously splits input signals $S_1$ to $S_N$ equally among output ports 19-1 to 19-M, each amplifier will typically amplify an equal amount of input signals $S_1$ to $S_N$. Hence, the amplifiers together form a balanced amplifier network. With the signals $S_1$ to $S_N$ spanning a range of frequencies, however, amplifiers 16-1 to 16-M will, if not perfectly linear, produce a finite amount of intermodulation distortion products at many frequencies. While IMD generation can be kept low by having no single amplifier saturated more deeply than the others, further IMD reduction can be achieved with the IMD detection and feedback control technique according to the present invention, to be described below.

Signal distribution to the antennas A1 to AN is effected by providing an "inverse" power sharing network 15, which is preferably an inverse Butler Matrix. Network 15 is advantageously identical to network 14, with the exception that the output ports are now used as input ports. Network 15 has M input ports 22-1 to 22-M (with M preferably equal to N), each coupled to one of the amplifier outputs, and N output ports 23-1 to 23-N, each coupled to one of antennas A1 to AN. Briefly, the output signal appearing on output ports 23-1 to 23-N is an inverse Fourier transform relative to the output signal of the first power sharing network. The amplified signals appearing on input ports 22-1 to 22-M with equal amplitude and predetermined phase gradients therebetween, will appear on one of the output ports 23-1 to 23-N, with the phase gradients being determinative of the particular output port at which each amplified, reconstructed signal will appear. (Preferably, these phase gradients are the same as those between the corresponding signals on the output ports 19-1 to 19-M). Hence, amplified signal $S_1$ will recombine within network 15 and appear on only one of output ports 23-1 to 23-N such as port 23-1 feeding antenna A1 to produce the beam B1. Analogously, amplified signal $S_N$ will recombine and appear only at antenna AN to produce beam BN.

Figure 2:
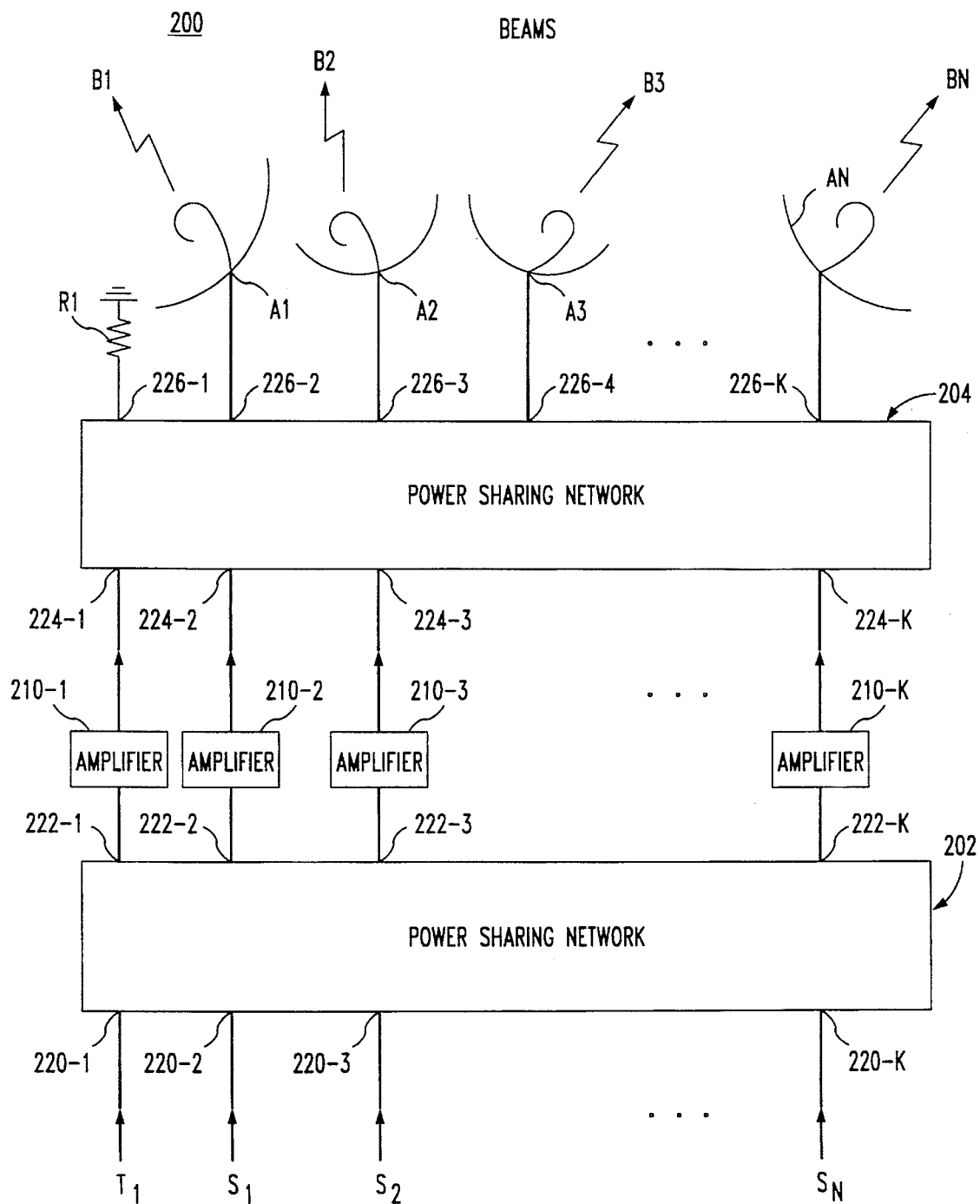
FIG. 2 shows a schematic diagram of a transmitting system of the present invention employing IMD detection and control for each amplifier.
Figure 3:
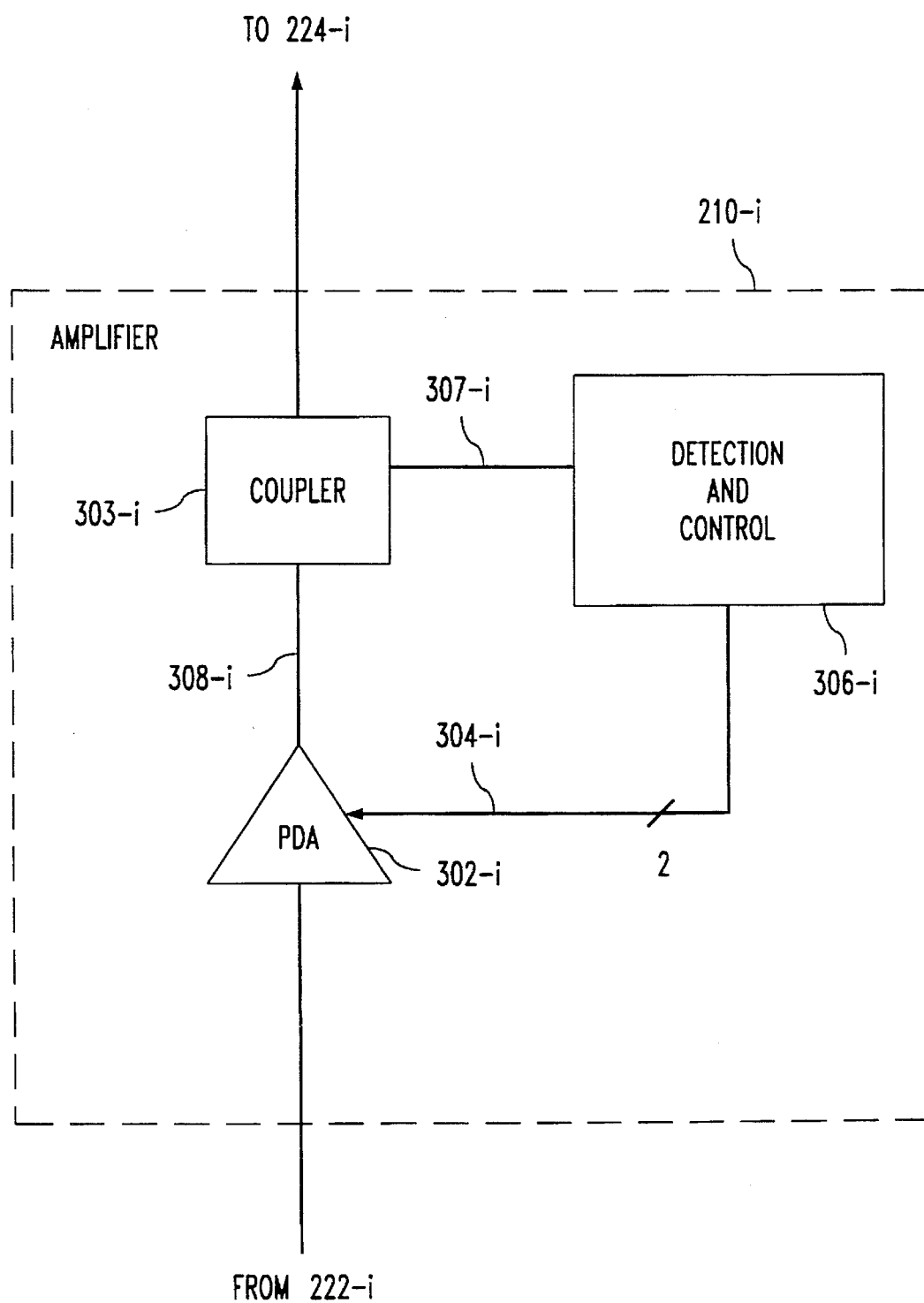
FIG. 3 shows a schematic diagram of a low distortion amplifier block, which can be used in embodiments of the present invention.

Referring now to FIG. 2, one embodiment of a transmitting system in accordance with the present invention is shown, designated generally by reference numeral 200. As was the case for the system of FIG. 1, system 200 is operable to amplify N input signals $S_1$ to $S_N$ to produce N corresponding electromagnetic antenna beams B1 to BN via the respective antennas A1 to AN. Typically, the beams B1 to BN produced by system 200 will have lower IMD products than in the beams of FIG. 1. IMD reduction can be effected by employing low distortion amplifier blocks 210-1 to 210-K (where K=N+1 in this example) in conjunction with an IMD detection scheme using an input test signal $T_1$. As shown in FIG. 3, each amplifier block 210-i typically includes predistortion amplifier (PDA) 302-i, directional coupler 303-i and detection and control block 306-i.

In FIG. 2, first power sharing network 202 is advantageously a K×K Butler Matrix with K input ports 220-1 to 220-K and K output ports 222-1 to 222-K, where K equals N+1. The additional input port enables the test signal $T_1$ to be applied to one of the input ports, such that the N signals $S_1$ to $S_N$ are applied to the other N ports. It is understood that more than (N+1) input and output ports could be provided so that additional test signals can be simultaneously applied.

Since Butler Matrices are well known in the art, the intricate circuit details of the power sharing networks described herein need not be elaborated upon. Generally, a Butler Matrix having K input ports and K output ports is known as a $\log_2 K$ stage Butler Matrix. One skilled in the art will appreciate that Butler Matrices can be designed with any number of desired ports, as is described in a paper entitled "Butler Network Extension to any Number of Antenna Ports", by H. E. Foster and R. E. Hiatt, IEEE Transactions on Antennas and Propagation (November 1970). In any event, it is also understood that while the power sharing networks described herein are preferably Butler Matrices, alternative network configurations may be used to effect desired power splitting and combining functions, such as Blass-type networks or other arrangements employing hybrid couplers or in-phase power dividers and phase shifters.

The test signal $T_1$ may be a two tone test signal whose frequencies, along with their intermodulation products, are advantageously chosen to avoid interference with the input signals $S_1$ to $S_N$. For instance, in wireless telecommunications applications the channels are widely separated, allowing the tone frequencies of the channels to be interspersed but still within the channel allotment of the given wireless communications provider. Hence, appropriate non-interfering frequencies for the test signal $T_1$ can easily be selected for this application. In any event, the amplitude of the test signal $T_1$ tones should be low enough to avoid significant loading of the amplifiers (PDAs) 302-1 to 302-K because the $T_1$ tones are not radiated but are instead terminated in a matched load R1. As such, the $T_1$ tones may have substantially lower signal power than any of the signals $S_1$ to $S_N$.

The $T_1$ signal is equally split among output ports 222-1 to 222-K with a predefined phase gradient therebetween, just as each input signal $S_1$ to $S_N$ is split among the output ports. As a result, each of the K PDAs amplifies all of the signals $S_1$ to $S_N$ as well as the test signal $T_1$ to produce K amplified PDA output signals. The RF signal energy of each PDA output signal is then coupled using a directional coupler, which is supplied to a detection and control block as shown in FIG. 3. Each detection and control block detects the IMD energy associated with the test signal $T_1$. The IMD products that result from the test signal are indicative of the IMD products of input signals $S_1$ to $S_N$. In this manner, the predistortion power of each PDA can be controlled to keep the IMD products of all the signals $S_1$ to $S_N$ to a low level.

The amplified PDA output signals are each applied to respective input ports 224-1 to 224-K of power sharing network 204, which is preferably an inverse K×K Butler Matrix. Network 204 is advantageously the same as network 202, except with the input and output ports reversed. With this configuration, only the amplified test signal $T_1$ power will appear at output port 226-1 to be dissipated in resistor R1; only the amplified $S_1$ signal will appear at antenna A1 to produce beam B1, and so on. Accordingly, none of the amplified test signal $T_1$ power will be radiated in the ideal case. In practice, manufacturing imperfections in the power sharing networks, as well as variations in gain and insertion phase of the PDAs will lead to some low level radiation of the test signal. Moreover, should one of the PDAs fail, an imperfect set of signals will be applied to input ports 224-1 to 224-K, which will cause a higher percentage of the amplified test signal power to be radiated.

It is also noted that for some applications, one may not be concerned about radiating the test signals, such as when the test signals are at different frequencies than the input signals and the filtering on the receiving end is sufficient to prevent interference. For these applications, multiple directional beams can also be provided by removing second power sharing network 204, and replacing the directional antennas A1 to AN and the resistor R1 with one or more linear or planar antenna arrays, with each formed by a plurality of broad beam antenna elements. In this case, with appropriate spacing of the antenna elements, and with each amplifier output feeding one of the antenna elements, directional beams will be formed such that each beam will contain the signal power of only one of the amplified input signals $S_1$ to $S_N$. In addition, one of the beams will contain only the amplified signal power of the test signal. If additional input and output ports are used to accommodate more than one test signal, additional beams will be formed, with each additional beam carrying only the associated test signal power. While this approach has the advantage of eliminating the second power sharing network, one key disadvantage is that at least one antenna beam will be associated only with test signal power—accordingly, this approach is not the preferred one.

Figure 4:
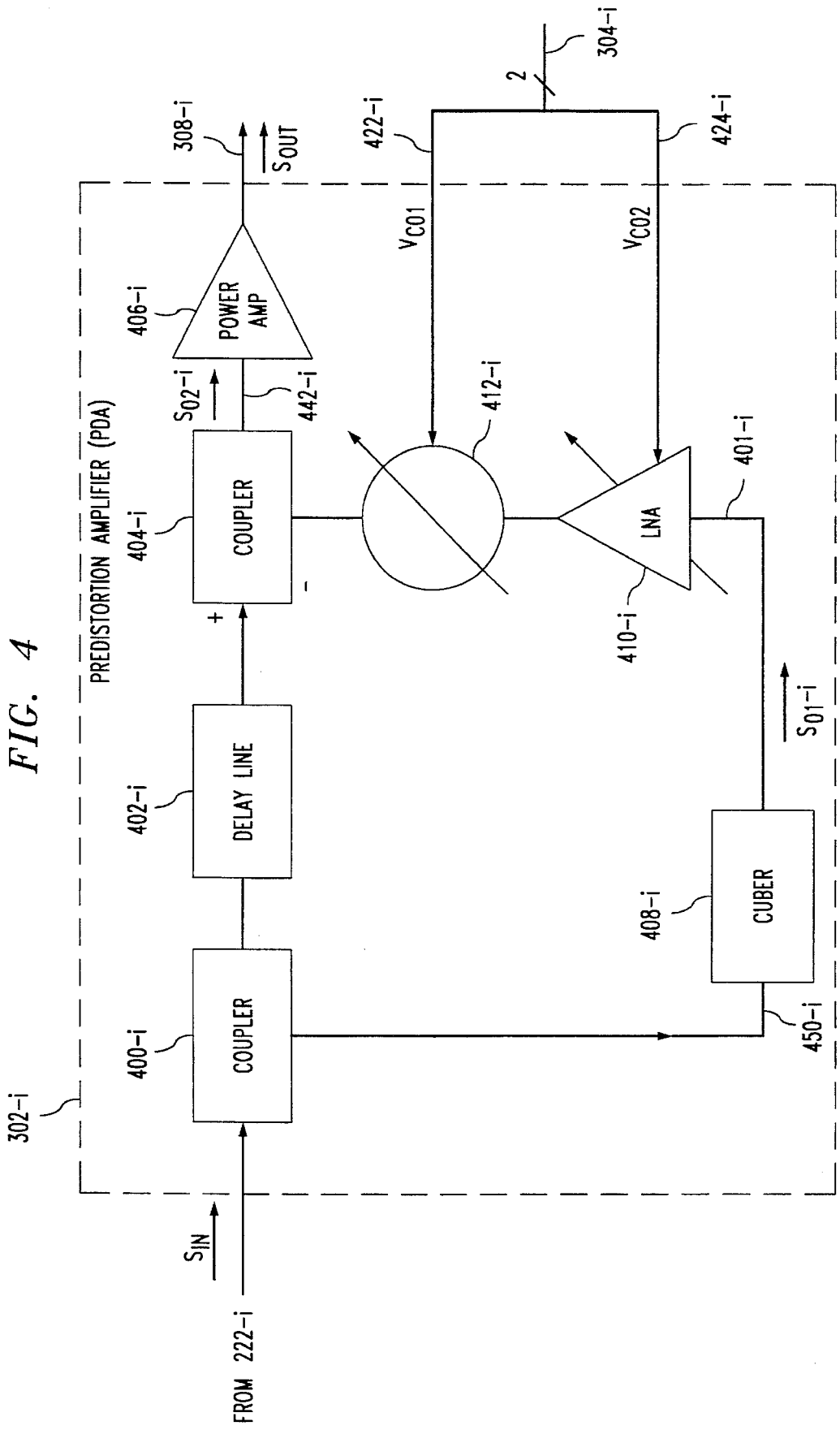
FIG. 4 shows a schematic diagram of a predistortion amplifier, which may be used within the amplifier block of FIG. 3.

Turning now to FIG. 4, an illustrative detailed configuration for the predistortion amplifiers (PDAs) is illustrated. PDA 302-i typically includes a predistortion path defined by splitter 400-i (e.g., a directional coupler), cuber circuit 408-i for providing at least third-order frequency power, variable-gain-low-noise amplifier (LNA) 410-i and variable phase shifter 412-i. The third-order power products produced by cuber circuit 408-i will be used to cancel third-order power products generated in main power amplifier 406-i to provide a substantially distortion free, amplified output signal $S_{OUT}$. (The $S_{OUT}$ signal is then applied to the respective input port of power sharing network 204 of FIG. 2.) The PDA 302-i configuration depicted in FIG. 4 is related to the subject matter of co-pending U.S. patent application, Ser. No. 08/534,371, filed Sep. 26, 1995, entitled "Low Distortion Amplifier", assigned to the assignee herein, and incorporated by reference.

Figure 7:
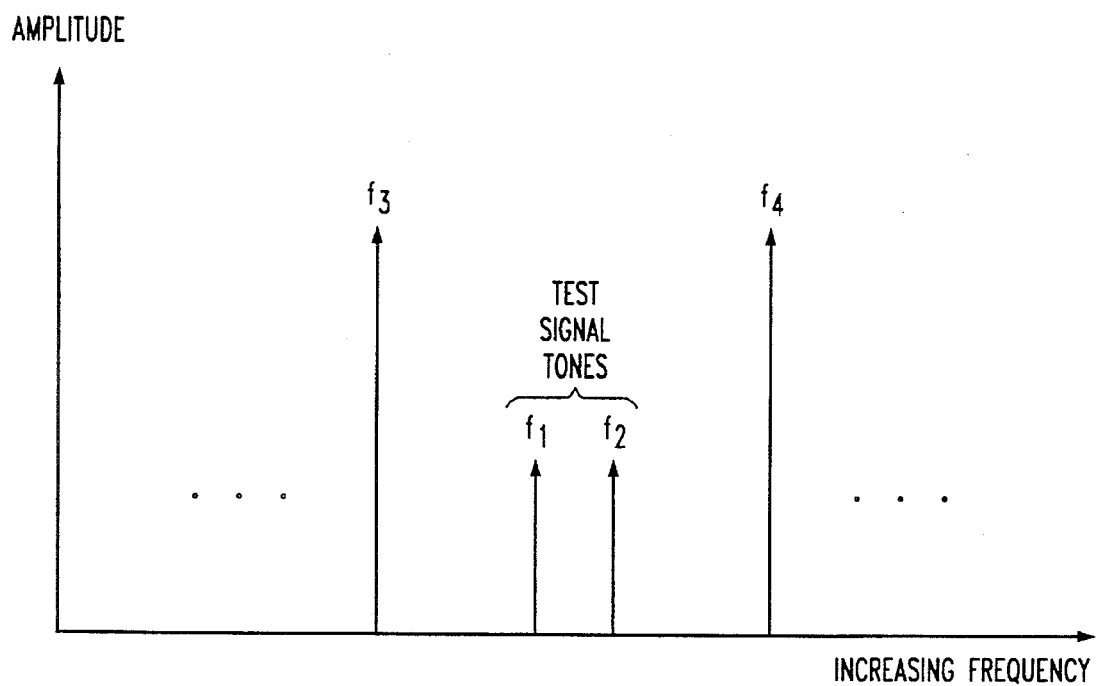
FIGS. 7 and 8 depict selected frequency components of signals flowing within the circuit of FIG. 4.

Signal $S_{IN}$ present on line 222-i, is applied to PDA 302-i, and includes the frequency components of the signals $S_1$ to $S_N$ and the multiple tones of the test signal $T_1$—for example, at frequencies $f_1$ and $f_2$ for the two tone case. A vector representation of the frequency components of signal $S_{IN}$ is depicted in FIG. 7. Signal $S_{IN}$ is shown to include carriers at frequencies $f_3$ and $f_4$ of an information-bearing signal, such as FDM signal $S_1$, as well as test signal $T_1$ tones at frequencies $f_1$ and $f_2$. Carriers of other information-bearing signals $S_2$–$S_N$ are omitted for clarity but are understood to be included within signal $S_{IN}$.

Figure 8:
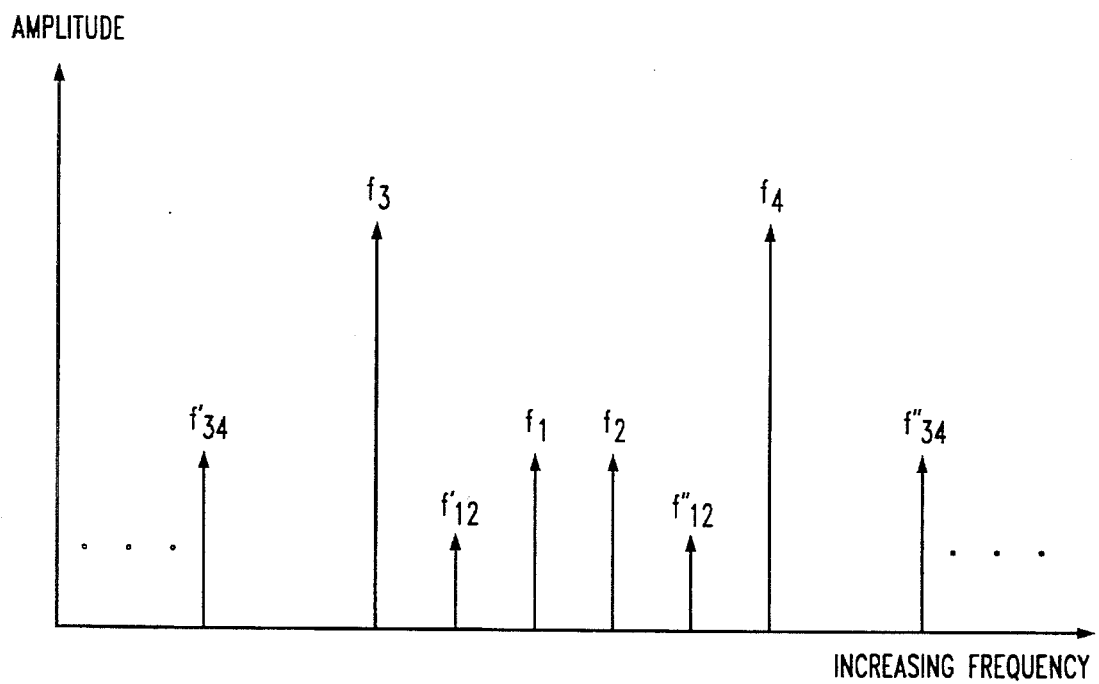

The $S_{IN}$ signal power coupled to cuber 408-i produces a cuber output signal $S_{01}$-i on line 401-i. As shown in FIG. 8, signal $S_{01}$-i contains some fundamental frequency power, and a predefined amount of third-order power at frequencies $f_{12}'=2f_1-f_2$ and $f_{12}''=2f_2-f_1$ due to the test signal $T_1$ tones, and at frequencies $f_{34}'=2f_3-f_4$ and $f_{34}''=2f_4-f_3$ due to the signal $S_1$ carriers. Signal $S_{01}$-i also contains other third-order IMD products of the $S_1$ to $S_N$ frequency components, (not shown) which, along with the power at frequencies $f_{34}''$ and $f_{34}'''$, will provide the desired cancellation in main amplifier 406-i.

The cubing function is realized by the use of an anti-parallel diode pair within cuber 408-i, as is disclosed in the co-pending patent application cited above. Fifth and higher order products of the $S_{01}$-i signal produced by cuber 408-i are preferably kept at least 30 dB lower than the third-order power produced over the operating range of cuber 408-i. This way, third-order cancellation of at least 30 dB can be achieved in main amplifier 406-i while the higher order IMD products of the $S_{OUT}$ signal remain below the third-order IMD levels.

Signal power of the $S_{IN}$ signal and of the $S_{01}$-i signal will vectorially combine in coupler 404-i, which is configured as a subtracter, to produce a signal $S_{02}$-i that is applied on line 442-i to power amplifier 406-i. The IMD cancellation in amplifier 406-i will be ideal when the distortion components of $S_{OUT}$ that are due to the amplification of the distortion components of the $S_{02}$-i input signal, are of equal amplitude and 180° out of phase with the IMD components of $S_{OUT}$ that result from the simultaneous amplification of the fundamental frequencies of $S_{02}$-i. Cancellation is optimized when the amplitude and phase of the $S_{02}$-i distortion components are at an optimized, predetermined relationship with respect to those of the fundamental components of the $S_{02}$-i signal. Phase alignment is realized with the use of variable phase shifter 412-i and delay line 402-i to independently control the phases of the distortion and fundamental frequency components. The phase shift of phase shifter 412-i is controlled by a control voltage $V_{c01}$, on line 422-i (part of control line set 304-i). Amplitude alignment is attained with the use of variable gain LNA 410-i, which has its gain controlled as a function of a control signal $V_{c02}$ supplied on line 424-i from detection and control block 306-i. It is noted that amplitude alignment may alternatively be implemented by employing a variable attenuator (not shown) between LNA 410-i and phase shifter 412-i, and by supplying the control signal $V_{c02}$ to the variable attenuator to control its loss, rather than to LNA 410-i. In yet another alternative to phase and amplitude control, variable phase shifter 412-i could be replaced by a vector attenuator (not shown) having in-phase (I) and quadrature phase (Q) control ports. In this case, the control signals $V_{co1}$ and $V_{co2}$ would be applied to the I and Q ports to thereby control loss and insertion phase of the vector attenuator.

Figure 5:
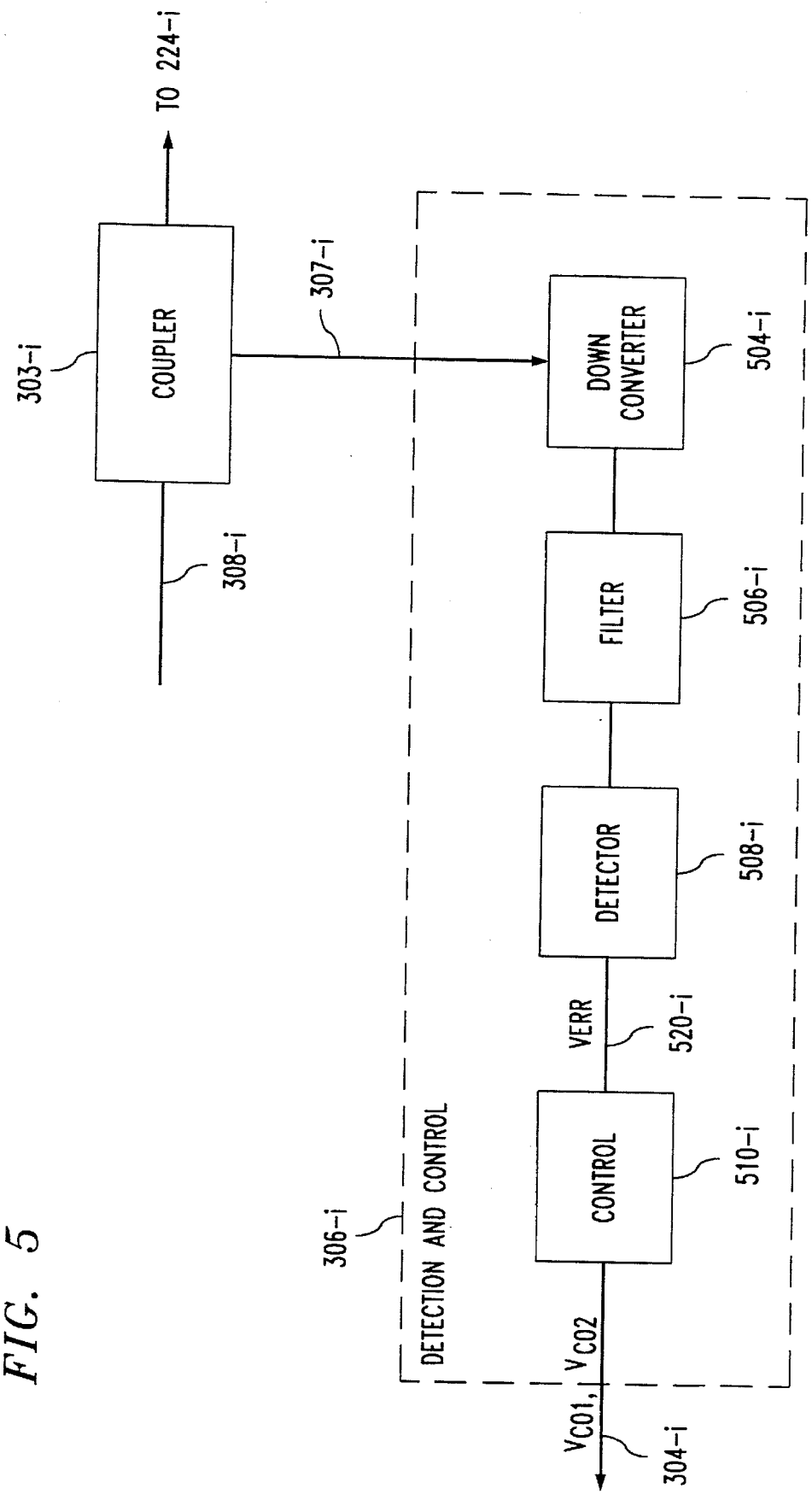
FIG. 5 illustrates a block diagram of a detection and control block that may be used within the amplifier block of FIG. 3.

FIG. 5 shows an exemplary configuration for the detection and control block. Detection and control block 306-i operates to continuously adjust the control voltages $V_{co1}$ and $V_{co2}$, and hence, the LNA 410-i gain and phase shift of phase shifter 412-i, whenever the test signal $T_1$ is a part of signal $S_{IN}$. Detection and control is typically effected by directional coupler 303-i coupling a sample of the $S_{OUT}$ signal on line 307-i towards down-converter 504-i, where the sample is translated down to IF frequencies. The down-converted IF is applied to a narrow bandpass filter 506-i, which has a resonant frequency at one of the test signal $T_1$ IMD product frequencies $f_{12}'$ or $f_{12}''$. (It is noted that down-converter 504-i could be eliminated in an alternate configuration, whereupon bandpass filter 506-i would have to resonate at one of the higher RF frequencies. This approach is not preferred, since narrow filters are more difficult to realize at higher frequencies such as UHF). The passed IMD power is then applied to diode detector 508-i, which provides an error voltage $V_{ERR}$ that is proportional to the test signal $T_1$ IMD power. When this voltage $V_{ERR}$ is below a minimum threshold, maximum IMD cancellation of frequencies $f_{12}'$ and $f_{12}''$ has occurred within amplifier 406-i.

Since power amplifier 406-i has relatively uniform performance over the frequency range encompassed by the $S_1$ to $S_N$ signals, the voltage $V_{ERR}$ will be indicative of the IMD power generated over the entire frequency range even though the measurement is performed at only one frequency $f_{12}'$ or $f_{12}''$ within that range. If, however, a broad frequency range is used and it is desired to assure uniform cancellation over the whole band, the test signal $T_1$ can be tailored to contain four tones, for example, with two tones at the lower end of the band and the other two tones at the higher end of the band. In this case, two narrow bandpass filters 506-i can be employed in parallel to independently measure the IMD generation at the low and high band edges. The power passed by the two filters in parallel could then be combined and detected with detector 508-i to produce the $V_{ERR}$ signal as a more accurate measure of average IMD power over the band. Alternatively, two or more test signals, each with two or more tones, could be applied to additional input ports 220-i of the Butler Matrix 202 of FIG. 2 to accomplish the same result.

In addition, even if the test signal $T_1$ is applied to the Butler Matrix at a relatively low power level compared to that of the other signals $S_1$ to $S_N$, as is preferred, the voltage $V_{ERR}$ will nevertheless be a reliable measure of the IMD generation at the higher input power levels of $S_1$ to $S_N$. Accordingly, the test signal $T_1$ can be applied with low enough power so as to avoid generating significant IMD products between the test signals and the information signals.

When the voltage $V_{ERR}$ is above the minimum threshold, thereby indicating that the IMD cancellation is not optimized, control block 510-i will increase or decrease the control voltages $V_{co1}$ and/or $V_{co2}$, and hence, the distortion power of the $S_{o2}$-i signal. This will produce a change in the $V_{ERR}$ signal that will be detected by control block 510-i to determine if the preceding change in $V_{co1}$ and/or $V_{co2}$ was in the correct direction (i.e., in the direction of decreasing $V_{ERR}$). Control block 510-i will then respond with further increases or decreases in $V_{co1}$ and/or $V_{co2}$ until $V_{ERR}$ falls below the minimum threshold. This variation in the control voltages can continue indefinitely in order to automatically compensate for IMD variations within amplifier 406-i. Such IMD variations will inevitably occur due to temperature variations, changes in the total input power to the amplifier, and so on. For instance, in wireless telecommunication applications the total input power will be proportional to the number of simultaneous users—hence the input power is constantly changing. By continually monitoring the IMD level and thereby controlling the predistortion signal into the power amplifier, dynamic range is markedly improved.

Figure 6:
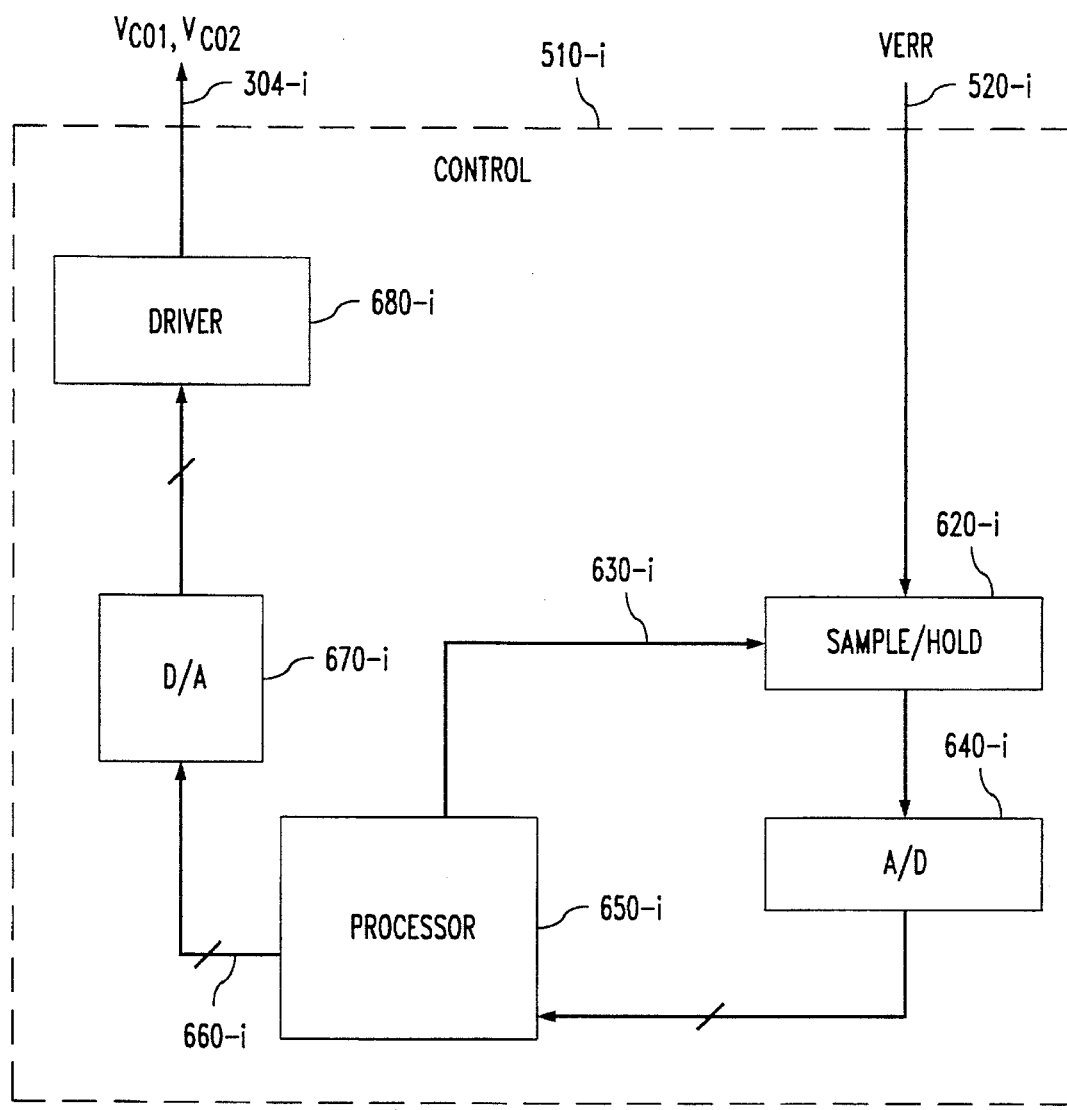
FIG. 6 depicts a block diagram of a control block that may be used within the detection and control block of FIG. 5.

With reference now to FIG. 6, an exemplary configuration for control block 510-i is shown. The error signal $V_{ERR}$ present on line 520-i originating from the diode detector, is sampled by sample and hold (S/H) circuit 620-i at time intervals determined by a control signal on line 630-i, supplied by processor 650-i. The sampled output from S/H circuit 620-i is then supplied to analog-to-digital (A/D) converter 640-i, which produces a digital word indicative of the sampled voltage level. If $V_{ERR}$ is below the predetermined minimum threshold, the digital word will be all zeroes or some other predefined codeword. The digital word is supplied to processor 650-i.

Processor 650-i continuously provides a pair of output codewords on parallel output lines 660-i that will be determinative of the low noise amplifier gain (or variable attenuator or vector attenuator loss, if used) and the phase shift of phase shifter 412-i. Digital to analog (D/A) converter 670-i converts these codewords to analog voltages, which are then buffered by driver 680-i and supplied as the control voltages $V_{co1}$ and $V_{co2}$ to LNA 410-i and phase shifter 412-i, respectively. (If the LNA or phase shifter have a digital interface, control words rather than an analog control voltage would be supplied thereto and D/A converter 670-i would be eliminated). When the digital word supplied to the processor by A/D converter 640-i indicates that $V_{ERR}$ is above the minimum threshold, processor 650-i will change the value of one or both of its output codewords, thereby increasing or decreasing $V_{co1}$ and/or $V_{co2}$. At a predetermined time interval thereafter, processor 650-i commands sample and hold circuit 620-i to sample $V_{ERR}$ so that the processor can determine if the previous increase or decrease in $V_{co1}$ and/or $V_{co2}$ resulted in a decrease in $V_{ERR}$. Processor 650-i will then respond with additional changes in $V_{co1}$ and/or $V_{co2}$ until $V_{ERR}$ falls below the minimum threshold. When this occurs, the sampling will continue at periodic intervals, but control voltages $V_{co1}$ and $V_{co2}$ will remain fixed until $V_{ERR}$ rises above the threshold again, whereupon the control voltage variation procedure will be repeated.

Figure 9:
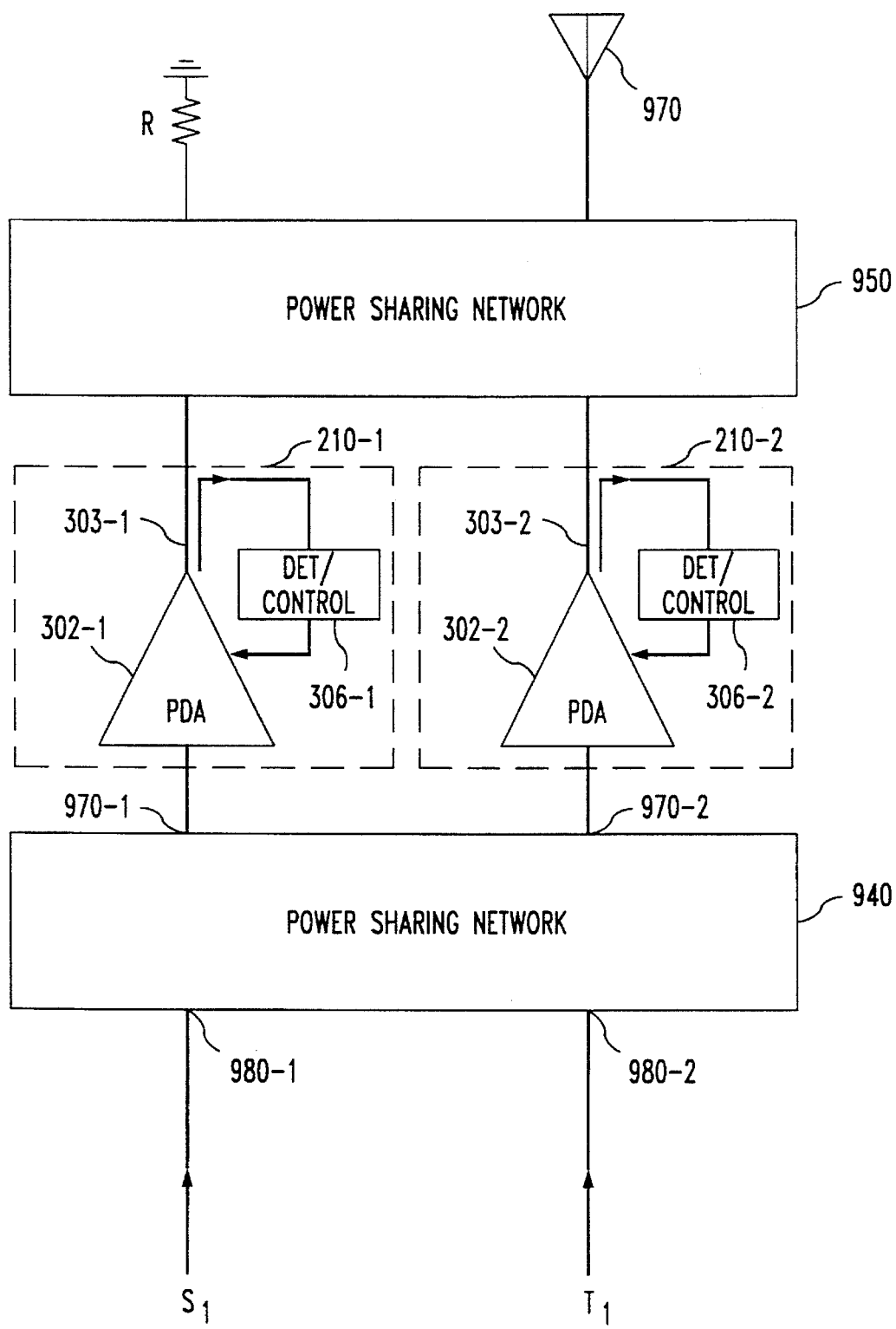
FIG. 9 shows a schematic diagram of a low distortion, single sector transmitting system in accordance with the present invention.

Referring now to FIG. 9, another embodiment of the present invention is transmitting system 900, which employs a single omnidirectional antenna 970. System 900 is essentially a special case of transmitting system 200 of FIG. 2, in that a pair of power sharing networks 940 and 950 are each configured as 2×2 Butler matrices—hence, if "N" equals one in FIG. 2, the system 900 can be realized. A multifrequency input signal $S_1$, which may contain modulated signals over an entire wireless telecommunications frequency band, is applied to input ports 980-1. The signal is split between output ports 970-1 and 970-2 of network 940, amplified by the amplifier blocks 210-1 and 210-2, and recombined in power sharing network 950 to appear only at antenna 970, where it is radiated. Likewise, the test signal $T_1$ applied to input port 980-2 is split and amplified by amplifier blocks 210-1 and 210-2, and then recombined to appear only at the termination R. Accordingly, it is seen that the IMD detection and reduction technique of the present invention is also applicable to wireless transmitting systems of the single sector, omnidirectional type.

Figure 10:
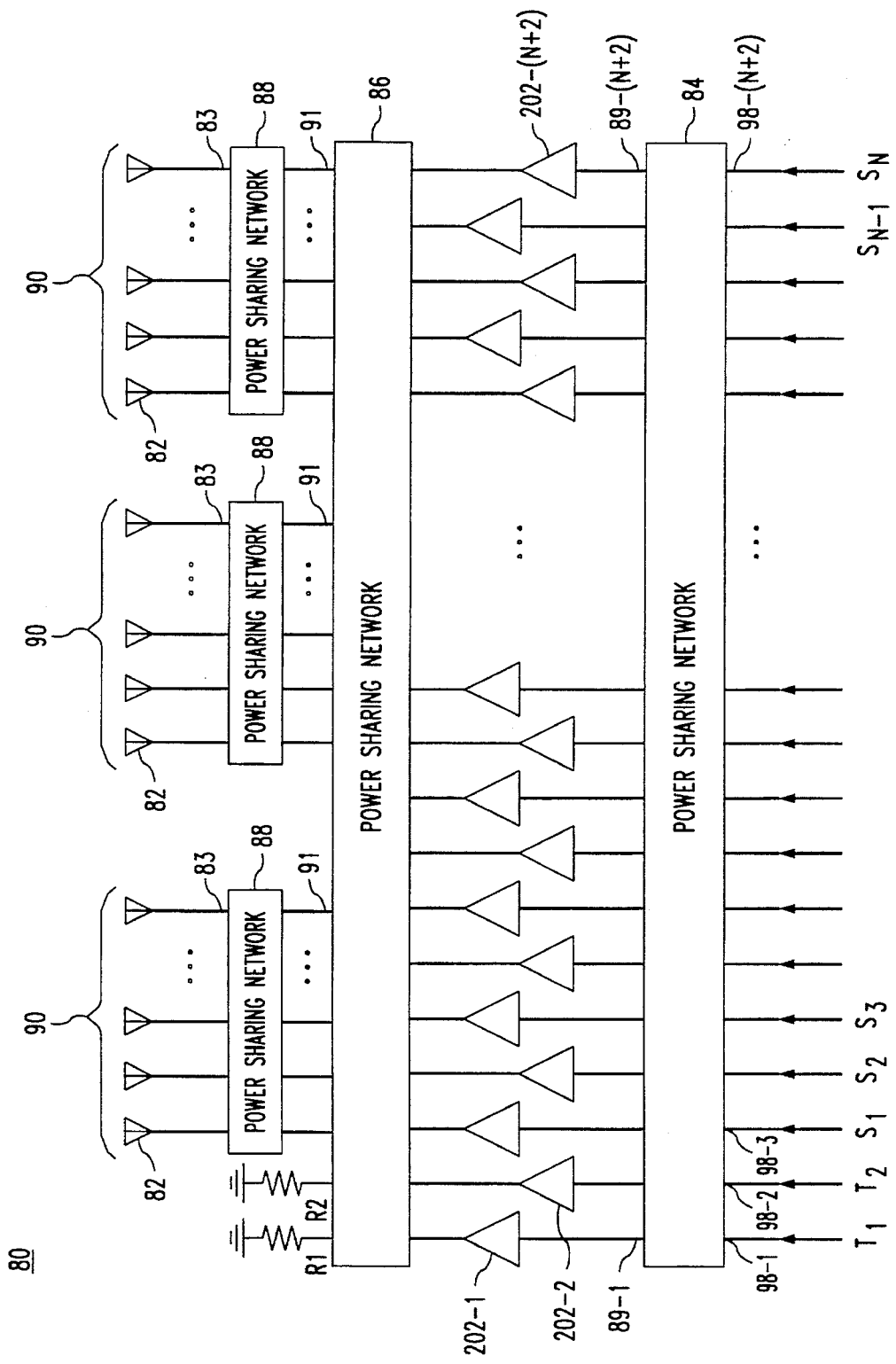
FIG. 10 illustrates a schematic diagram of a multiple directional beam, low distortion transmitting system in accordance with the present invention.

With reference now to FIG. 10, the IMD detection and reduction technique of the present invention is incorporated in a multi-sector transmitting system 80 employing three antenna apertures 90 in the shown exemplary case. Each aperture 90 contains a plurality of broad beam antenna elements 82 coupled to a respective output port 83 of an associated power sharing network 88, preferably a log 2P stage Butler Matrix, where P is the number of output ports 83 of each network 88. With this configuration, each antenna aperture 90 can provide a multiplicity of narrow directional beams within a given azimuthal angular sector, such as 120 degrees. Each signal appearing on one of the ports 91 will produce a distinct beam in a given direction. Each input signal $S_1$ to $S_N$ will appear on one of the ports 91 and will be radiated only in one directional beam.

Input signals $S_1$ to $S_N$ are applied to input ports 98-3 to 98-(N+2), respectively, of power sharing network 84. Test signals $T_1$ and $T_2$, each of which may be a dual tone signal, are applied to respective input ports 98-1 and 98-2. In this manner, each of amplifier blocks 202-i will amplify signal power of both test signals $T_1$ and $T_2$ and of the input signals $S_1$ to $S_N$. Each amplifier block 202-i may include the aforementioned predistortion amplifier 302-i, coupler 303-i and detection and control block 306-i to provide low distortion amplification over a wide dynamic range. The $S_1$ to $S_N$ signals are then recombined in the power sharing network 86, which is the inverse of the network 84, so that each signal $S_1$ to $S_N$ appears only on one of the output ports 91. The networks 84 and 86 are configured so that the amplified test signal $T_1$ is recombined to appear only at the termination R1, while the amplified test signal $T_2$ appears only at the termination R2. Accordingly, only the amplified power of the input signals $S_1$ to $S_N$ is radiated.

Figure 11:
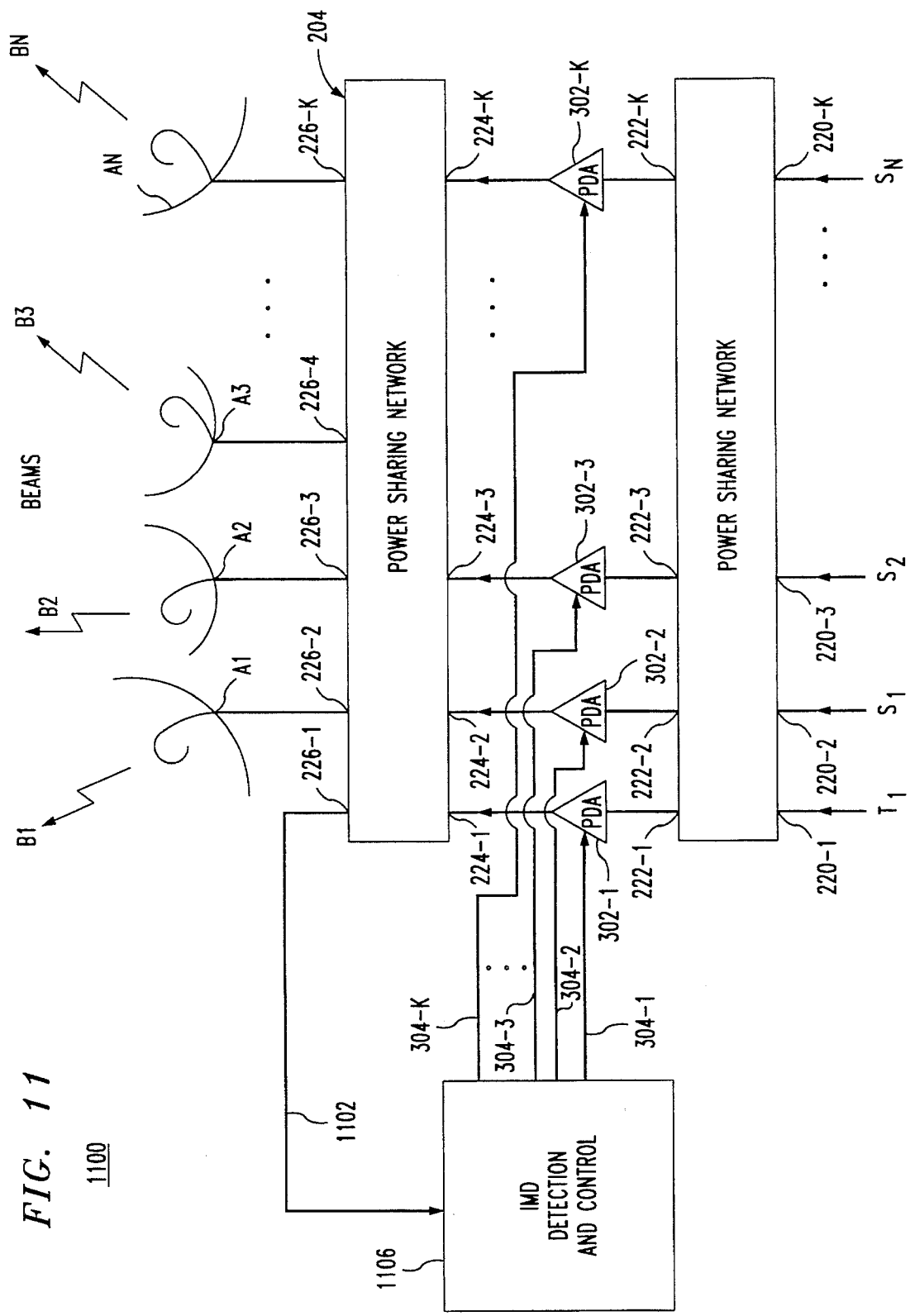
FIG. 11 shows an alternate embodiment of a transmitting system in accordance with the present invention.

FIG. 11 shows an alternate embodiment of the present invention, designated generally as transmitting system 1100. System 1100 includes the previously described K×K power sharing networks 202 and 204. Multi-tone test signal $T_1$ and input signals $S_1$–$S_N$ are applied to respective input ports 220-1 to 220-K of network 202, each being split among output ports 222-1 to 222-K, where K=N+1. Input signals $S_1$–$S_N$ are amplified and then recombined within network 204, such that transmission of the amplified signals by respective antennas A1–AN is possible. Test signal $T_1$ is likewise amplified and recombined in network 204, such that only amplified test signal power appears on output port 226-1 of network 204.

In FIG. 11, each composite signal on ports 222-i is amplified by a corresponding predistortion amplifier (PDA) 302-i, also previously described. Instead of each PDA 302-i being controlled by a separate control circuit, each PDA has its IMD products detected and reduced by a single IMD detection and control block 1106, via an associated control line set 304-i. IMD detection and control block 1106 is operational to continually detect the IMD products associated with the test signal $T_1$ tones, which is also indicative of the IMD products of signals $S_1$–$S_N$. Predistortion power to the main amplifiers within the PDAs is then controlled in accordance with the IMD power detected so as to continually reduce IMD product power.

Figure 12:
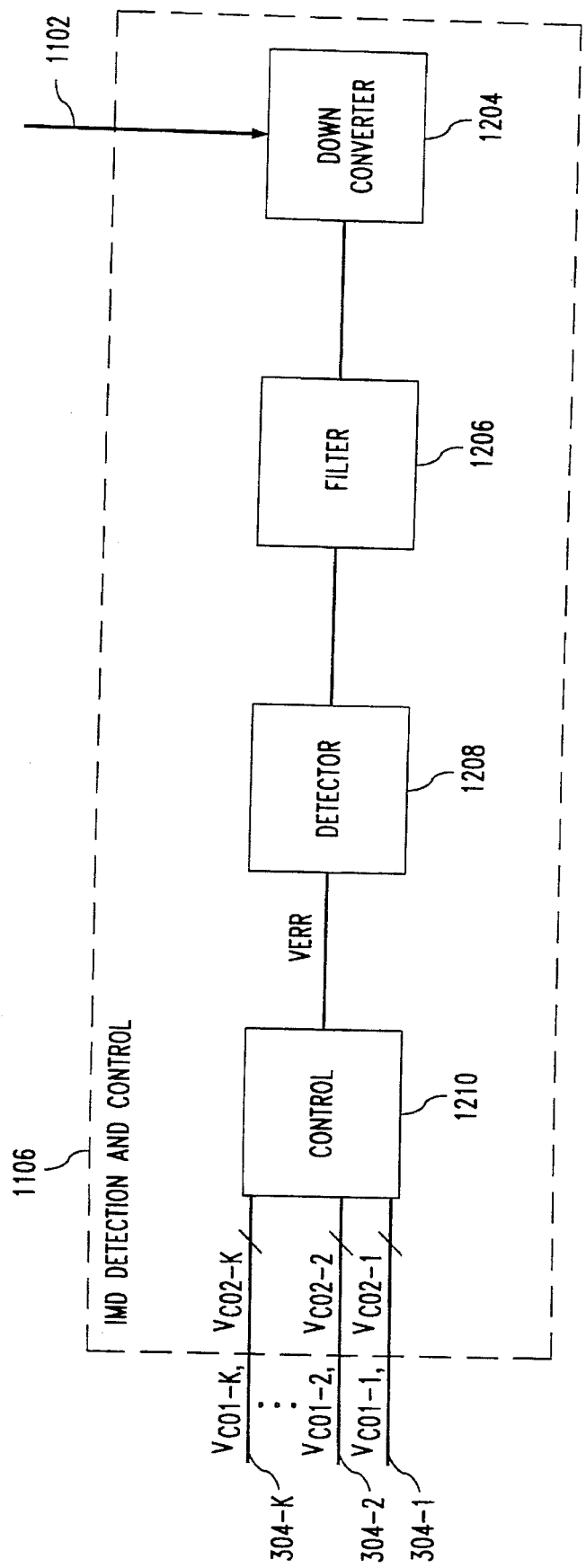
FIG. 12 is a block diagram of an IMD detection and control block that may be used within the system of FIG. 11.

FIG. 12 depicts a block diagram of an exemplary IMD detection and control block 1106. Signal power on line 1102 is down converted to IF frequencies by down-converter 1204, and then filtered by narrow bandpass filter 1206, which has a resonant frequency at one of the IMD product frequencies of the test signal $T_1$ tones. The filtered signal power is detected by detector 1208, which provides an error voltage $V_{ERR}$, proportional to the detected power, to control circuit 1210. Control circuit 1210 may be similar to control circuit 510-i described above in reference to FIG. 6, except that K output control line sets 304-1 to 304-K are provided, with each control line set comprised of two control lines, one for associated control signal $V_{c01}$-i and the other for $V_{c02}$-i. (Control signals $V_{c01}$-1 to $V_{c01}$-K control the phase of third-order signal power within respective PDAs 302-1 to 302-K; control signals $V_{c02}$-1 to $V_{c02}$-K control amplitude of third-order signal power within respective PDAs 302-1 to 302-K). Thus, different values of control signals $V_{c01}$-1 to $V_{c01}$-K may be provided to optimize predistortion power and hence, IMD reduction, within each PDA; likewise, the values of $V_{c02}$-1 to $V_{c02}$-K may differ from one another to individually optimize linearity of each PDA.

Optimization of control signals $V_{c01}$-1 to $V_{c01}$-K and $V_{c02}$-1 to $V_{c02}$-K by control block 1210, responsive to a single error voltage $V_{ERR}$, may be accomplished through use of a suitable algorithm within the processor therein. An example of a suitable algorithm is the Least Mean Square (LMS) algorithm, which has been used in the past to compute complex weights (amplitude and phase) of antenna elements in adaptive antenna arrays based upon a single error voltage. Likewise, optimized complex weights of the third-order predistorter signal within each PDA 304-i may be computed with a similar algorithm. An example of the LMS algorithm approach in adaptive arrays is found in "Adaptive Antenna Systems", B. Widrow et al., Proceedings of the IEEE, Vol. 55, No. 12, December, 1967, pp. 2143–2159.

A special case of the embodiment of FIG. 11 is where N=1 and K=2. This case has application for a single sector, omnidirectional telecommunication system, employing only one transmitting antenna.

The embodiment of FIG. 11 can be modified such that a plurality of test signals are applied to an associated plurality of input ports 220-1 to 220-K. Then, test signal power will be present at more than one of output ports 226-1 to 226-K. IMD detection and control block 1102 would then be coupled to each of the output ports 226-i that have test signal power thereon. Control voltages $V_{c01}$-i and $V_{c02}$-i would be then be further responsive to the IMD power detected at the additional output ports 226-i.

In the various embodiments of the present invention described herein, the IMD power generated in each predistortion amplifier 302-i was described as having been detected, with the detected IMD power used to control the predistortion energy applied to the amplifier to further reduce IMD power. While this approach is advantageous, it is understood that if so desired, the IMD power detected could be used merely to monitor amplifier performance rather than to provide continuous adjustment of the PDAs 302-i. If the detection system is only used for monitoring purposes, the PDAs 302-i need not be of the predistortion type—they could be feed forward amplifiers, for example. Moreover, one may wish to detect the IMD energy of only some as opposed to all of the PDAs 302-i, to reduce complexity while obtaining a sample of the system's IMD performance. In either of the above cases, the other features of the present invention will remain the same—e.g., adding one or more test ports to the power sharing networks to allow a test signal to be applied without it being radiated, and so on.

Thus disclosed are various embodiments of an IMD detection system of the present invention. A common virtue of the disclosed embodiments is that, aside from the numerous advantages of the power shared linear network, each predistortion amplifier can be independently controlled for optimum IMD performance. As the IMD product generation is continually kept at minimum levels with the feedback control system of the present invention embodiments, dynamic range of the amplifiers is improved, while interference due to IMD generation is minimized.

It will be understood that the embodiments shown herein are merely exemplary and that one skilled in the art can make many variations and modifications to the shown embodiments without departing from the spirit and scope of the invention. All such variations and modifications are intended to be included within the scope of the invention as defined by the appended claims.

We claim:

1. An intermodulation distortion (IMD) detection system for use in a power shared amplifier network capable of amplifying at least one input signal, comprising:
   a first power sharing network having a plurality of first input ports, with at least one of said first input ports receiving at least one associated test signal and with at least one other of said first input ports receiving said at least one input signal, said first power sharing network splitting each of said at least one input signal and said at least one test signal between a plurality of first output ports, thereby producing a composite signal at each said first output port having signal power of said at least one test signal and of said at least one input signal;
   a plurality of amplifier circuits, each coupled to an associated one of said first output ports and amplifying an associated one of said composite signals;
   a second power sharing network having a plurality of second input ports coupled to associated ones of said amplifier circuits, and having a plurality of second output ports, for providing amplified signal power of said at least one test signal on at least one associated second output port, and amplified signal power of said at least one input signal on at least one other of said second output ports; and
   at least one of said amplifier circuits including detection circuitry for detecting IMD product power associated with said at least one test signal.

2. The IMD detection system according to claim 1, wherein each of said at least one amplifier circuits further includes a control circuit coupled to said detection circuitry, for controlling IMD product power generated within the amplifier circuit responsive to said detected IMD product power associated with said test signal.

3. The IMD detection system according to claim 2, wherein each of said at least one amplifier circuits further includes:
   a main amplifier for amplifying said signal energy of said associated composite signal; and
   a predistortion circuit for supplying distortion frequency power to said main amplifier to cancel distortion products generated in said main amplifier during amplification of said associated composite signal.

4. The IMD detection system according to claim 3, wherein each said predistortion circuit is coupled to an associated detection and control circuit, each said detection and control circuit including said detection circuitry and said control circuit, and operable to detect IMD product power generated in said associated main amplifier due to amplification of said test signal, and capable of varying the magnitude and phase of said distortion frequency power supplied to said main amplifier responsive to the amount of IMD product power detected.

5. The IMD detection system according to claim 3, wherein each said predistortion circuit includes:
   a directional coupler for splitting the associated composite signal into a direct path signal and a coupled path signal;
   a cuber circuit for converting the coupled path signal into a cuber output signal having at least third-order distortion power;
   a variable gain, low noise amplifier (LNA) for amplifying said tuber output signal to provide an LNA output signal;
   a summing circuit for vectorially combining said LNA output signal with said direct path signal to provide a predistortion signal having fundamental frequency power and distortion frequency power, said predistortion signal being supplied to said main amplifier; and
   a variable phase shifter coupled between said LNA and said summing circuit;
   wherein said main amplifier is operable to amplify said predistortion signal to provide an amplifier output signal containing amplified signal energy of said at least one test signal and of said at least one input signal.

6. The IMD detection system according to claim 5, wherein:
   each said predistortion circuit is coupled to an associated detection and control circuit, each said detection and control circuit including said detection circuitry and said control circuit;
   each said detection and control circuit capable of providing an error signal indicative of the IMD power detected, and providing first and second control signals to said LNA and phase shifter, respectively, responsive to said error signal, to control gain of said LNA and phase shift of said phase shifter and thereby control distortion frequency power supplied to said main amplifier to cancel IMD products generated therein.

7. The IMD detection system according to claim 6, wherein each said control circuit comprises:
   a sample and hold circuit for sampling said error signal;
   an analog-to-digital (A/D) converter, coupled to said sample and hold circuit, for providing a digital word indicative of said sampled error signal;
   a processor, coupled to said A/D converter, for providing output codewords indicative of said first and second control signals, responsive to said digital word, and for controlling sampling intervals of said sample and hold circuit, said processor operable to vary said codewords whenever said digital word indicates that said error signal is above a predetermined threshold.

8. The IMD detection system according to claim 1, wherein said first and second power sharing networks each comprise a Butler Matrix.

9. The IMD detection system according to claim 1, wherein:
   said plurality of first input ports comprises two input ports and said plurality of first output ports comprises two output ports;
   said plurality of amplifiers comprises two amplifiers;
   said plurality of second input ports comprises two input ports and said plurality of second output ports comprises two output ports;
   said at least one input signal comprises one input signal operatively coupled to one of said first input ports; and said at least one test signal comprises one test signal operatively coupled to the other of said first input ports.

10. The IMD detection system according to claim 2, wherein:

said at least one test signal comprises a single, dual tone signal having frequencies f1 and f2; and said detection circuitry including a bandpass filter for passing energy associated with IMD products of $f_1$ and $f_2$, whereby the magnitude of the energy so passed is also indicative of IMD product power produced in the amplifier circuit due to amplification of said at least one input signal.

11. The IMD detection system according to claim 1, wherein said at least one test signal comprises a plurality of test signals, each operatively coupled to an associated one of said first input ports, wherein a portion of each said test signal forms a portion of each said composite signal and is amplified by each of said amplifier circuits.

12. The IMD detection system according to claim 1, further comprising at least one termination resistor coupled to associated of said at least one second output ports, for terminating amplified test signal power.

13. In a power shared amplifier network including a power sharing network having a plurality of input ports and a plurality of output ports, and a plurality of amplifiers, each coupled to an associated one of said output ports, a method for detecting intermodulation distortion (IMD) products generated by at least one of said amplifiers during amplification of at least one input signal, said method comprising:

applying said at least one input signal to at least one associated input port of said power sharing network;

applying at least one test signal to at least one associated other input port of said power sharing network, wherein a composite signal is formed at each said output port having signal power of each said at least one input signal and said at least one test signal;

amplifying each said composite signal with an associated one of said amplifiers; and detecting IMD product power produced during said amplifying due to amplification of said at least one test signal, whereby the IMD product power so detected is also indicative of IMD product power produced due to amplification of said at least one input signal.

14. The method according to claim 13, further comprising:

providing a further power sharing network having a plurality of further input ports and a plurality of further output ports;

applying amplified composite signal power produced by each said amplifier to associated of said further input ports;

reconstructing said amplified composite signals within said further power sharing network such that amplified test signal power appears only at particular ones of said further output ports, and amplified input signal power appears only at other associated said further output ports.

15. The method according to claim 13, wherein said test signal is applied to said power sharing network at a substantially lower power level than said input signal.

16. The method according to claim 13, further comprising predistorting the signal energy of said at least one input signal and said at least one test signal, responsive to the magnitude of the IMD product power detected, to reduce IMD product generation by said associated at least one amplifier.

17. The method according to claim 13, wherein fundamental frequencies of said at least one test signal, and IMD product frequencies generated due to amplification of said test signal, are exclusive of frequencies of said at least one input signal and of IMD product frequencies generated due to amplification of said at least one input signal.

18. A transmitting system for radiating at least one electromagnetic antenna beam carrying amplified signal power of at least one associated input signal, said system comprising:

a first power sharing network having a plurality of first input ports, with at least one of said first input ports receiving at least one associated test signal and with at least one other of said first input ports receiving said at least one input signal, said power sharing network splitting each of said at least one input signal and said at least one test signal between a plurality of first output ports thereof, thereby producing a composite signal at each said first output port having signal power of said at least one test signal and of said at least one input signal;

a plurality of amplifier circuits, each coupled to an associated one of said first output ports and amplifying an associated one of said composite signals;

a second power sharing network having a plurality of second input ports coupled to associated ones of said amplifier circuits, and having a plurality of second output ports, for providing amplified signal power of said at least one test signal on at least one associated second output port, and amplified signal power of said at least one input signal on at least one other of said second output ports;

at least one antenna coupled to said second output ports, for radiating said at least one antenna beam; and at least one of said amplifier circuits including detection circuitry for detecting IMD product power associated with said at least one test signal.

19. The transmitting system according to claim 18, wherein each of said at least one amplifier circuits further includes a control circuit coupled to said detection circuitry, for controlling IMD product power generated within the amplifier circuit responsive to said detected IMD product power associated with said test signal.

20. The transmitting system according to claim 19, wherein:

said at least one input signal comprises a plurality of input signals;

said at least one antenna comprises a plurality of antennas, each coupled to one of said second output ports associated with said input signals, each said antenna radiating one of said antenna beams; and said transmitting system further including at least one termination coupled to said at least one second output port having amplified test signal power thereon, for terminating substantially all of said amplified test signal power.

21. An intermodulation distortion (IMD) detection system for use in a power shared amplifier network capable of amplifying at least one input signal, comprising:

a first power sharing network having a plurality of first input ports, with at least one of said first input ports receiving a test signal and with other of said first input ports receiving said at least one input signal, said first power sharing network splitting each of said at least one input signal and said test signal between a plurality of first output ports, thereby producing a composite signal at each said first output port having signal power of said test signal and of said at least one input signal;

a plurality of amplifiers, each coupled to an associated one of said first output ports and amplifying an associated one of said composite signals;

a second power sharing network having a plurality of second input ports coupled to associated ones of said amplifiers, and having a plurality of second output ports, for providing amplified signal power of said test signal at an associated second output port, and amplified signal power of said at least one input signal at other of said second output ports; and a detection and control circuit coupled between said associated second output port and said amplifiers, for receiving amplified test signal power and detecting IMD products of said test signal, and controlling IMD product generation within said amplifiers responsive to said detected IMD products of said test signal.

22. The detection system according to claim 21, wherein each of said amplifiers comprise predistortion amplifiers, and wherein said detection and control circuit is operable to control IMD product generation within each of said amplifiers by controlling amplitude and phase of a predistortion signal therein.

23. The detection system according to claim 22, wherein said detection and control circuit includes processing means for computing a complex weight of each said predistortion signal based on said IMD power detected, wherein said detection and control circuit is operative to provide associated control signals to each said amplifier in accordance with said complex weights to individually control IMD product generation within each said amplifier.

24. In a power shared amplifier network including a first power sharing network having a plurality of first input ports and a plurality of first output ports, a second power sharing network having a plurality of second input ports and a plurality of second output ports, and a plurality of amplifiers, each coupled between associated ones of said first output ports and said second input ports, a method for detecting intermodulation distortion (IMD) products generated by at least one of said amplifiers during amplification of at least one input signal, said method comprising:

applying said at least one input signal to at least one associated first input port of said first power sharing network;

applying at least one test signal to at least one associated other first input port of said first power sharing network;

forming a composite signal at each said first output port having signal power of said at least one input signal and said at least one test signal;

amplifying each said composite signal with an associated one of said amplifiers;

reconstructing amplified said composite signals, within said second power sharing network, to provide at least one amplified test signal on associated at least one second output port, and amplified signal power of at least one input signal on associated at least one other of said second output ports;

detecting IMD product power of said amplified test signal present at said associated at least one second output port; and controlling IMD product generation within said amplifiers responsive to said detected IMD product power of said at least one amplified test signal.

25. The method according to claim 24, further comprising:

predistorting each said composite signal to reduce IMD products generated within each said amplifier; and controlling predistortion of each said composite signal responsive to said detected IMD product power of said at least one amplified test signal.

26. The method according to claim 25, wherein said controlling predistortion of each said composite signal includes computing a complex weight for each said composite signal and controlling predistortion of each said composite signal further responsive to said complex weight.

* * * * *